(12) United States Patent
Magera et al.

(10) Patent No.: US 7,451,540 B2
(45) Date of Patent: Nov. 18, 2008

(54) METHOD FOR FABRICATING A PRINTED CIRCUIT BOARD

(75) Inventors: Jaroslaw A. Magera, Palatine, IL (US); Gregory J. Dunn, Arlington Heights, IL (US); Jovica Savic, Downers Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 94 days.

(21) Appl. No.: 11/552,368

(22) Filed: Oct. 24, 2006

(65) Prior Publication Data
US 2008/0092376 A1    Apr. 24, 2008

(51) Int. Cl.
H05K 3/02     (2006.01)
B05D 5/12     (2006.01)

(52) U.S. Cl. .............................. 29/846; 29/825; 29/840; 29/847; 427/96.1

(58) Field of Classification Search .................. 29/832, 29/840, 846, 847, 848, 842
See application file for complete search history.

(56) References Cited

U.S. PATENT DOCUMENTS

| 3,181,986 | A | * | 5/1965 | Pritikin ....................... 156/233 |
|---|---|---|---|---|
| 3,324,014 | A | * | 6/1967 | Modjeska .................... 205/122 |
| 4,357,395 | A | * | 11/1982 | Lifshin et al. ............... 428/607 |
| 4,383,003 | A | * | 5/1983 | Lifshin et al. ............... 428/611 |
| 4,431,710 | A | * | 2/1984 | Lifshin et al. ............... 428/650 |
| 4,722,765 | A | * | 2/1988 | Ambros et al. ................ 216/16 |
| 5,063,658 | A | * | 11/1991 | Wild ........................... 29/846 |
| 5,806,177 | A | * | 9/1998 | Hosomi et al. ................ 29/846 |
| 6,103,134 | A |   | 8/2000 | Dunn et al. |
| 6,143,116 | A |   | 11/2000 | Hayashi et al. |
| 6,195,882 | B1 | * | 3/2001 | Tsukamoto et al. .......... 29/852 |
| 6,207,259 | B1 |   | 3/2001 | Iino et al. |
| 6,256,866 | B1 |   | 7/2001 | Dunn |
| 6,440,318 | B1 |   | 8/2002 | Lee et al. |
| 6,518,514 | B2 |   | 2/2003 | Suzuki et al. |
| 6,532,651 | B1 | * | 3/2003 | Andou et al. ................. 29/852 |
| 6,748,652 | B2 | * | 6/2004 | Andou et al. ................. 29/852 |
| 7,080,448 | B2 | * | 7/2006 | Wu et al. ...................... 29/852 |

* cited by examiner

Primary Examiner—C. J Arbes

(57) ABSTRACT

Fabricating (100, 1300) a printed circuit board includes fabricating patterned conductive traces (305, 310, 1410, 1415) onto a foil, laminating the patterned conductive traces to a printed circuit board substrate (405, 1505) by pressing on the foil, such that the conductive traces are pressed into a dielectric layer of the printed circuit board, and removing the foil to expose a co-planar surface of conductive trace surfaces and dielectric surfaces. Removal may be done by peeling (125) and/or etching (130, 1315).

15 Claims, 6 Drawing Sheets

METHOD FOR FABRICATING A PRINTED CIRCUIT BOARD

FIELD OF THE INVENTION

The present invention relates generally to printed circuit boards, and more particularly to printed circuit boards having conductive patterns that may be used for the addition of embedded components.

BACKGROUND

A printed circuit board surface typically comprises 10-40-micron-thick copper features, commonly formed by subtractive patterning, on a polymer substrate such as FR-4. The topography of this surface presents several problems for the formation of embedded capacitors and resistors.

For screen printed polymer thick film resistors, the non-planar surface interferes with the squeegee motion, resulting in variability and thus inferior resistor tolerances. In addition, squeegee downward deflection between the two copper terminations of a resistor varies according to the length of the resistor—greater deflection occurs with longer resistors—which results in a non-linear dependence of resistance on length. This non-linearity also contributes to poor resistor tolerances when a range of resistor values is being printed. The problems become more severe for thicker conductor requirements. Finally, even the FR-4 surface on which a resistor body is printed is not smooth, but has a roughness that ranges from 3 to 12 microns, which is the impression left by the copper "tooth". This roughness also compromises resistor tolerances, because it is on the order of one third or one half the resistor thickness.

For ceramic-filled polymer (CFP) embedded capacitors, the non-planar board surface makes it difficult to form a thin dielectric layer of uniform thickness. For low-flow embedded capacitance materials such as a CFP-coated foil distributed by Oak-Mitsui Technologies of Hoosick Falls, N.Y., the CFP resin does not fill the spaces between copper features, resulting in air pockets. For high-flow materials such as a CFP liquid resin distributed by Huntsman Corporation of Salt Lake City, Utah, the resin often fills the spaces between copper features, but unacceptably thin dielectric may result at the copper feature edges, risking shorts when the top electrode copper is applied. In addition, dielectric thickness over capacitor bottom electrodes will typically vary according to the particular board design. Dielectric thickness will typically vary even within one board design, the resin tending to planarize more readily over smaller copper features, resulting in a thinner dielectric than over large copper features.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate some embodiments of, and explain various principles and advantages of concepts that include the claimed invention.

Figure 1:
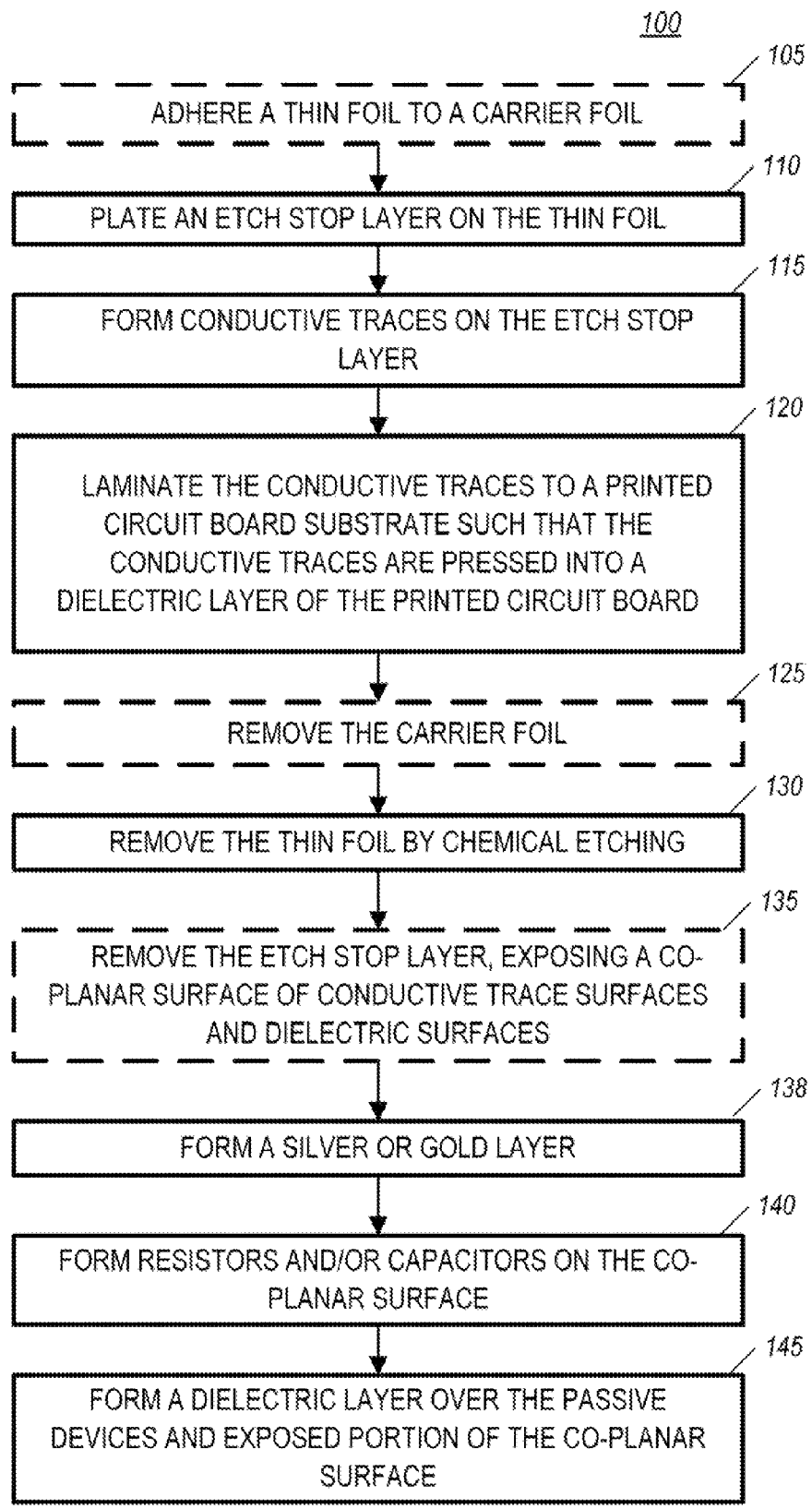
FIG. 1 is a flow chart of a method in accordance with certain of the embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the concepts.

DETAILED DESCRIPTION

Before certain embodiments are described in detail, it should be observed that the embodiments reside primarily in combinations of method steps and apparatus components related to printed circuit boards having conductive patterns that are used for embedded components. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Referring to FIG. 1, some steps of a method 100 for fabricating a printed circuit board are shown, in accordance with certain embodiments. These steps will be described in conjunction with FIGS. 2-9, which are cross sectional diagrams of a foil assembly 200 and a portion of a printed circuit board 400 that is in the process of having printed capacitors and/or resistors added to a layer.

Figure 2:
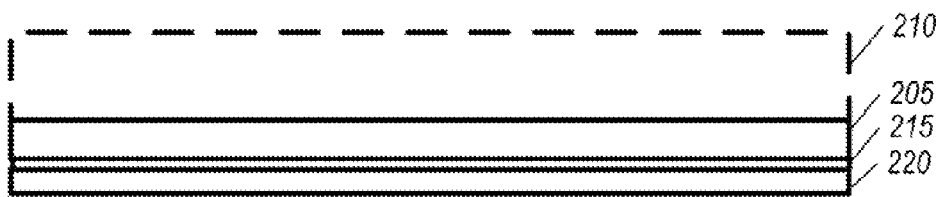
FIGS. 2-3 are cross section diagrams of a foil assembly in accordance with certain of the embodiments.

At step 105 (FIG. 1), which is optional, a thin foil 205 (FIG. 2) may be adhered to a carrier foil 210 (FIG. 2). The thin foil 205 may be a conductive metal foil, for example, a copper foil of a conventional type that is used in printed circuit board fabrication that may be 1 to 50 microns thick. The thin foil 205 is optionally adhered to the carrier foil 210 as a means to provide an assembly that can be handled with less risk of damaging the thin foil 205 after the thin foil 205 has been adhered to the carrier foil 210, and during subsequent processing. The need for such a carrier foil 210 may be dependent upon such factors as the type of handling that is used and the thickness of the thin foil 205. The carrier foil 210 may be a metallic foil chosen to reliably support the assembly during its handling. The carrier foil 210 may be, for example, a copper foil that is 50 to 1000 microns thick when the thin foil 205 is less than or equal to approximately 10 microns thick. An adhesive (not shown in FIG. 2) that is used to adhere the thin foil 205 to the carrier foil 210 may be a conventional adhesive (or some new adhesive) that is chosen for adhesive characteristics that retain the thin foil to the carrier foil during the handling and processing of the assembly and yet allow easy and reliable removal (i.e., the carrier foil is removed in one piece with forces that can be easily applied using hand tools) of the carrier foil 210 at later step. An example of such adhesive is a co-deposited admixture of a metal (nickel, chromium, titanium, copper, manganese, iron, cobalt, tungsten, molybdenum, or tantalum) and a non-metal (oxides, phosphates, and chromates of the metal) such as that described in U.S. Pat. No. 6,346,335, B1 issued to Chen et al. on Feb. 12, 2002. Examples of organic release layers include nitrogen-containing organic compounds such as 1,2,3-benzotriazole (BTA) and carboxybenzotriazole (CBTA), or sulfur-containing compounds such as mercaptobenzothiazole (MBT), thiocyanuric acid (TCA), and 2-benzimidazolethiol (BIT), or carboxylic acids such as oleic acid, linoleic acid, or linolenic acid, as described in EP patent 1,152,069, B1 issued to Taenaka et al. on Dec. 4, 2006.

At step 110 (FIG. 1), an etch stop layer 215 (FIG. 2) may be panel plated as a continuous layer onto the thin foil 205. The etch stop layer 215 may be a conventional etch stop material that is widely used as a reliable etch stop for an etchant that is used in a later step of method 100 that removes the thin foil 205, but the etch stop layer 215 may be of another type, either known or new, that is a reliable etch stop for the etchant that is used in the later step of method 100. In some embodiments, the etch stop layer 215 is electrically conductive. Some examples of materials that may be used for the etch stop layer 215 are nickel, tin, solder (tin-lead alloy), gold, tin-nickel alloy, and silver.

At step 115 (FIG. 1), conductive traces may be formed on the etch stop layer 215. The term traces used here implies all manner of features of the patterned conductive metal, including, but not limited to, pads and electrodes. This may be performed using conventional printed circuit board subtractive patterning techniques, which may, for example, include panel plating a conductive metal layer 220 (FIG. 2) on the panel plated etch stop layer, applying and patterning an etch resist to protect portions of the panel plated conductive metal layer and etching the unprotected panel plated conductive metal layer. The conductive metal layer 220 may be, for example, a 10 to 50 micron layer of copper that is added using electrolytic panel plating. Other metals may be used, and the conductive metal layer 220 may be added using other conventional techniques or new techniques. The conductive metal layer 220 may then be patterned in step 115 using conventional subtractive techniques using, for example, conventional lithography and etchants, or new techniques later developed. Alternative techniques may be used to form the patterned conductive traces onto the panel plated etch stop layer 215, such as conventional or new pattern plating techniques. When pattern plating techniques are used instead of panel plating techniques to form the patterned conductive traces, then the full-paneled conductive metal layer 220 shown in FIG. 2 would not be formed. When the formation of the patterned circuit traces involves an etchant, the etchant may be referred to herein as the first etchant. The first etchant, when used, should be compatible with the etch stop layer 215 (i. e, not remove the material of the etch stop layer 215.) An example of a first etchant that may be used for formation of the patterned conductive traces is an alkaline ammoniacal etchant, for example Ultra Etch FL from MacDermid Incorporated, Waterbury, Conn. Another first etchant used to print and etch the panel plated copper when the etch stop layer is gold or a tin-nickel alloy is acid cupric chloride, for example CU-OX 310, available from Rohm and Haas Electronic Materials, Marlborough, Mass. In some embodiments described in more detail below, the etch stop layer is patterned to match the patterned conductive traces.

Figure 3:
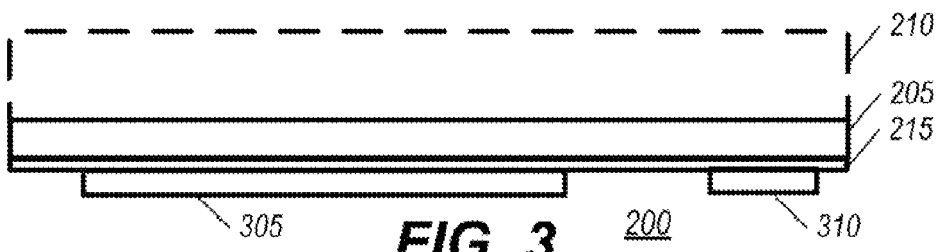

FIG. 3 is a cross sectional diagram that shows the portion of the foil assembly 200 having cross sections of two patterned conductive traces 305, 310. The thickness of the etch stop layer should be relatively small compared to the thickness of the patterned conductive traces 305, 310, in some embodiments. For example, the etch stop layer 215 may be less than 3 microns in some embodiments. In some embodiments, the etch stop may be substantially thicker (e.g., in some embodiments it could be any thickness as long as it does not cause undesirable side effects, such as distortion of the circuit traces or loss of adherence of the circuit traces, or excessive cost).

Figure 4:
FIGS. 4-9 are cross section diagrams of a foil assembly attached to a portion of a printed circuit board in accordance with certain of the embodiments.

At step 120 (FIG. 1), the conductive traces, including conductive traces 305, 310, are laminated to a dielectric layer 405 of a printed circuit board substrate such that the conductive traces are pressed into the dielectric layer 405 of the printed circuit board substrate, as shown in FIG. 4. In this context, the printed circuit board substrate means one or more layers of a printed circuit board that have been fabricated, excepting the dielectric layer 405, which is being fabricated during this and subsequent steps of this method. Pressure may be applied by using a conventional press that is typically used to laminate a layer of a printed circuit board to a substrate of the printed circuit board. It will be appreciated that the portion of the substrate into which the circuit traces are laminated may be a partially completed portion of a multilayer printed circuit board, in that the substrate may comprise fewer than the total number of layers that will be formed during the fabrication of the printed circuit board. Thus, the patterned conductive traces may be for an inner layer of the completed printed circuit board. In some embodiments, the substrate may be the upper layer of a nearly complete printed circuit board. The dielectric layer of the printed circuit board is sufficiently soft during the lamination process that the dielectric material flows around the patterned conductive traces and becomes flush with the surface of the etch stop layer 215 (or the surface of the thin foil 205 in some embodiments described in more detail below, in which the etch stop layer only exists between the patterned circuit traces and the thin foil 205). Furthermore, the dielectric layer of the printed circuit board is sufficiently soft during the lamination process that voids between the edges of the patterned conductive traces are either non-existent or very small relative to the dimensions of components that are later fabricated such that they bridge a patterned conductive trace and the dielectric material of dielectric layer 405 (for example, such voids may be less than 5 microns in some embodiments, and less than 2 microns in other embodiments). The dielectric layer 405 may be soft at this stage in the process, for example, because it is a B-stage (uncured) dielectric such as conventional pre-preg (glass weave impregnated with B-stage epoxy) that is later hardened by heat or other conventional methods. In other embodiments, the material of the dielectric layer 405 may be of a type that is softened at this stage in the process by heat, for example thermoplastics such as polyphenylene ether (PPE) or polyphenylene oxide (PPO). FIG. 4 illustrates a stage in the process at which the material of the dielectric layer 405 has flowed around the patterned conductive traces 305, 310.

Figure 5:
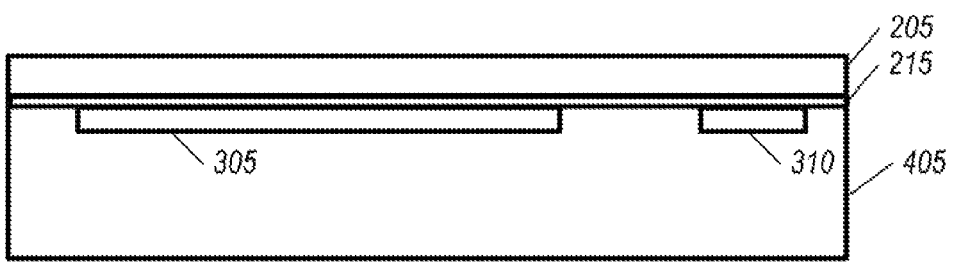

At step 125 (FIG. 1), the carrier foil 210 is removed, if a carrier foil has been used in the embodiment. Thus the adhesive to adhere the thin foil 205 to the carrier foil 210, and the material of the carrier foil, are chosen to perform reliably during the processes of the steps during which they are mated to the printed circuit board. FIG. 5 illustrates the portion of the printed circuit board 400 after the carrier foil 210 is removed or after step 120 when a carrier foil is not used.

Figure 6:
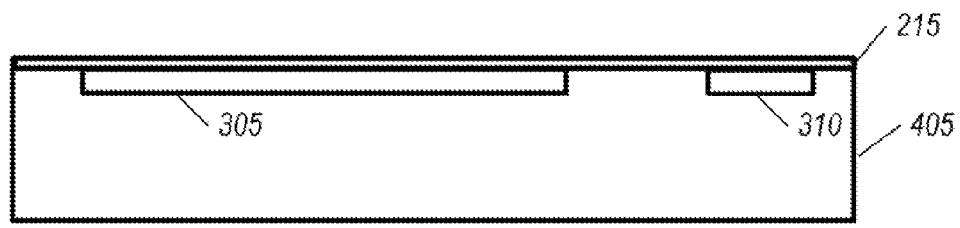

At step 130, the thin foil 205 is removed by chemical etching. The chemical used in the chemical etching (the etchant, which may herein be called the second etchant) may be any conventional material that is compatible with the etch stop layer 215 and the material of the dielectric layer 405. That is, the second etchant is one that is reliably prevented from etching through the etch stop layer 215 under normal production etching conditions, and one that will not substantially etch the material of the dielectric layer 405 in embodiments in which the material of the etch stop layer 215 remains only on the surfaces of the patterned circuit traces (as described in more detail below). Examples of second etchants for either embodiment are alkaline ammoniacal etchants (if the etch stop layer is solder, gold, tin, tin-nickel alloy, or silver) or acid cupric chloride etchants (if the stop layer is gold or a tin-nickel alloy). When the second etchant material is one that is effectively prevented from dissolving any adhesive material that may remain on the surface of the thin foil 205, then the adhesive material may be removed prior to using the second etchant, such as by using an appropriate etchant, for example alkaline permangante or solvent, for example gamma butyrolactone (GBL). The portion of the printed circuit board 400 at this stage is illustrated in FIG. 6.

Figure 7:
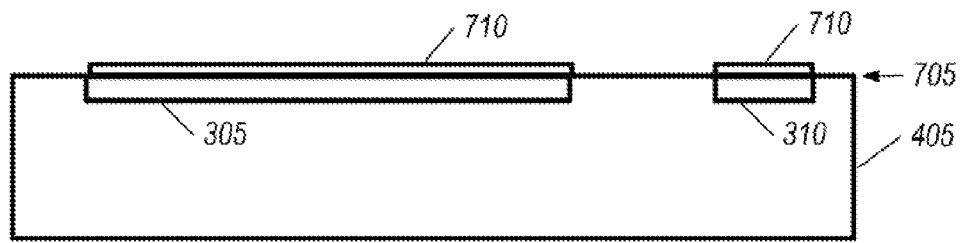

At step 135, the etch stop layer 215 is optionally removed. For example, when the etch stop layer 215 is formed from tin, it may be removed by etching in nitric acid based stripping solution such as Enthone®PC-1113, or peroxide bifluoride stripping solution such as Enthone®SS-2859, both available from Enthone Inc., West Haven, Conn. When the etch stop layer is nickel, it may be removed by etching in a solution of metanitrobenzenesulphonic acid and sulphuric acid, which will also etch the underlying copper, but this can be minimized by controlling the etch time to remove the thin nickel layer. In some embodiments described in more detail below, in which the etch stop layer is pattern plated and the patterned conductive traces are pattern plated, it may be acceptable to leave the etch stop layer in place. When the etch stop layer is removed, a thin layer of silver or gold may be formed on the surfaces of the patterned conductive traces 305, 310. This layer of silver or gold may be added as immersion layers, as are well known in the art, or by other techniques known in the art or newly developed. Immersion silver typically comprises silver and polymer, while immersion gold is typically substantially pure. The layer of silver or gold is typically in a range of 0.02 to 1 micron thick. The portion of the printed circuit board 400 when step 135 is completed is illustrated in FIG. 7.

It will be appreciated that the removal of the thin foil layer, the removal of the etch stop layer 215, and addition of the immersion silver or immersion gold leaves a substantially smooth surface 705 comprising surfaces of the patterned circuit traces that are substantially flush with the surface of the dielectric layer 405. In those embodiments described in more detail below, in which the etch stop layer 215 remains only on the copper at the start of this step and in which the etch stop layer is removed, the removal of the etch stop layer leaves depressions at the patterned circuit traces that are substantially shallow (ranging from 0.07 to 2.5 microns) relative to the inherent variations of the dielectric surface, so that an overall surface is provided that is sufficiently smooth to provide the desired benefits, which are described below. As a result, the surface 705 that is exposed is termed herein a co-planar surface 705 of dielectric surfaces and patterned conductive trace surfaces. In embodiments described in more detail below, in which the etch stop layer 215 remains only on the patterned conductive traces at the start of this step and in which the etch stop layer is not removed, the etch stop layer surface is substantially flush with the surface of the dielectric layer, and the overall surface is sufficiently smooth to provide the desired benefits, and is also termed a co-planar surface. Alternatively, in those embodiments in which the etch stop layer remains only on the patterned conductive traces at the beginning of this step, and in which the etch stop is removed, it may be replaced by another selectively patterned metal layer such as immersion silver to form the co-planar surface 705. The resulting co-planar surface 705 in any of the embodiments described herein is substantially smoother than surfaces that result when conventional methods are used to provide patterned circuit traces, since the smoothness is largely determined by the relatively larger dimension of the thickness of the patterned circuit traces (which are typically 10-50 microns).

Figure 8:
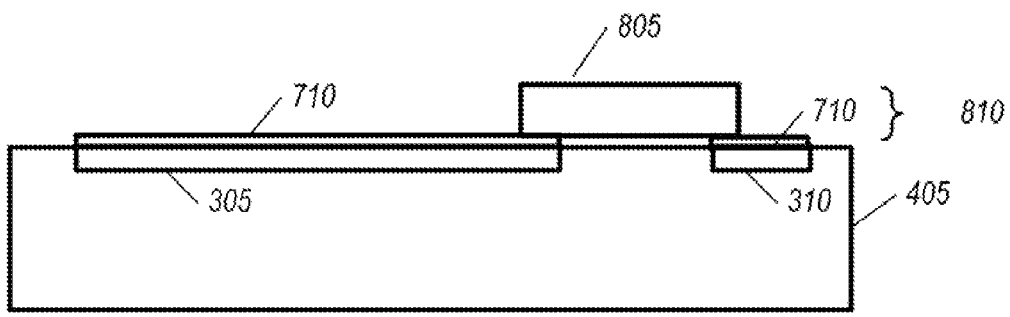

At step 140, polymer thick film resistors may be formed on the co-planar surface 705, in a manner that benefits from the embodiments for the following reasons. The resistors may be formed using conventional resistor printing techniques. The resistors may then be solidified using conventional techniques. Variations in the coplanar surface 705 are so small relative to a thickness of the printed resistors, as illustrated by printed resistor 805 and thickness 810 in FIG. 8, that the resistors are formed having much less variance than those formed using prior art techniques in which resistors are formed on top of a conventional dielectric layer having patterned circuit traces that extend from the surface of the dielectric layer upwards (in the direction of the printed resistor material). For example, conventional printed resistors may have a height 810 as small as 10 microns. The surface variations that result from embodiments described herein are 0.5 to 5 microns, whereas conventional techniques provide typical variations ranging from 10 microns to 50 microns. The portion of a printed circuit board 400 after printed resistors are formed is shown in FIG. 8.

After resistors are formed and solidified, or in embodiments in which no resistors are formed, a dielectric layer 905 may then be applied, using conventional dielectric materials such as standard circuit board polymer materials or polymers filled with high dielectric particles. Such dielectric materials may have a high or low flow characteristic and may be applied in liquid form or uncured sheet form. Some benefits of the embodiments described herein are that the co-planar surface 705 in a region of formation of a capacitor 910 allows for the formation of a dielectric layer 905 that has a thinner, more consistent thickness and fewer voids than dielectric layers in prior art printed circuit boards. Patterned circuit traces may be formed on the upper surface of the dielectric layer 905, including pads such as the pad 915 shown, which forms the capacitor 910 with a like pad area of the patterned conductive trace 305 that has been formed in dielectric layer 405. In some embodiments, the dielectric material 905 and the patterned circuit traces may be applied in the form of a unified structure. In some embodiments, there may be resistors formed on the surface 705 but no capacitors formed using a portion of the patterned conductive traces as one electrode.

As mentioned above, in some embodiments the etch stop layer 215 is patterned to match the patterned conductive traces 305, 310. This can be accomplished in at least two ways. In a first technique, the etch stop layer can be applied using a pattern plating technique and then the conductive traces can be applied using a pattern plating technique. One example of conventional materials that could be used for this embodiment is copper for the thin foil, nickel for the patterned etch stop, and copper for the patterned conductive traces. In a second technique, the etch stop layer and the conductive material for the patterned conductive traces can be applied using panel plating techniques, then the patterns for the patterned conductive traces can be formed and finally the matching patterns of the etch stop can be formed. One example of conventional materials that could be used for this embodiment is copper for the thin foil, tin for the patterned etch stop, and copper for the patterned conductive traces.

Figure 10:
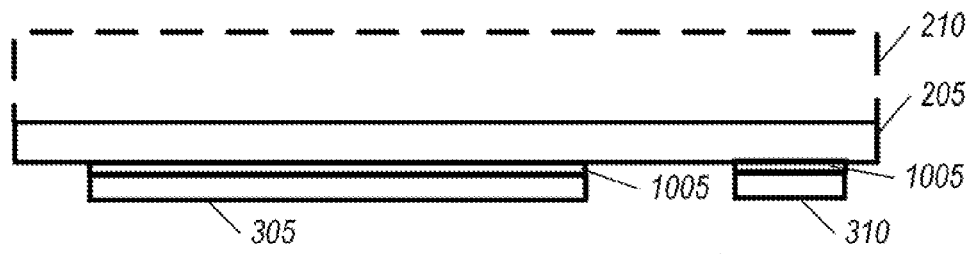
FIG. 10 is a cross section diagram of a foil assembly in accordance with certain of the embodiments.
Figure 11:
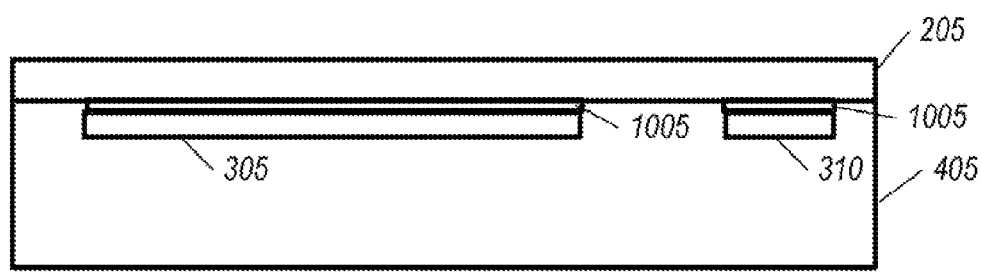
FIGS. 11-12 are cross section diagrams of a foil assembly attached to a portion of a printed circuit board in accordance with certain of the embodiments.

FIG. 10 is a cross section diagram that illustrates the foil assembly 200 for these embodiments, which in the example shown has patterned etch stops 1005 that match the patterned conductive traces 305, 310. It will be appreciated that for the embodiments described with reference to both FIG. 3 and FIG. 10, it may be said that an etch stop layer has been plated on the foil 205 and that patterned conductive traces have been formed on the etch stop layer 215. FIG. 11 is a cross sectional diagram that shows the portion of the circuit board 400 after the foil has been laminated to the printed circuit board as described above with reference to step 120 and the carrier foil 210 has been removed as described above with reference to step 125, or after step 120 when a carrier foil is not used.

Figure 12:
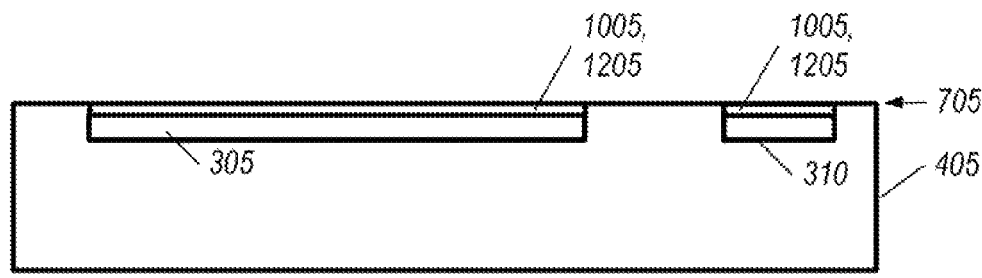

FIG. 12 is a cross sectional diagram that shows the portion of the circuit board 400 after the thin foil 205 has been removed from the printed circuit board, as described above with reference to step 130. It can be seen in FIG. 12 that if the patterned etch stop layer 1005 is of an electrically conductive material that will function reliably when left in place, then the surface of the etch stop layer 1005 is approximately co-planar with the surface 705 of the printed circuit board. If the patterned etch stop layer 1005 is not left in place, then the surfaces of the conductive traces 305, 310 can be made co-planar with the surface 705 of the printed circuit board by plating the patterned conductive traces 305, 310 with a conductive material 1205 (e.g., copper) of approximately the same thickness as the etch stop material 1005 that has been removed, forming patterned conductive traces that are substantially co-planar with the surface 705. However, in many instances, the patterned etch stop layer 1005 will be thin enough that adding conductive material to the surfaces of the conductive traces for the explicit purpose of increasing the smoothness of the surface is not necessary to attain co-planarity (as defined for co-planar, above). Whether or not the patterned etch stop layer 1005 is removed, a thin layer (0.02 to 2 microns) of silver or gold may be added to the surfaces of the patterned conductive traces, as described above with reference to FIG. 7. This layer is not explicitly shown in FIG. 12, and may be applied with sufficient thinness to maintain the co-planar aspect of the surface 705. When the etch stop layer has been removed in accordance with embodiments described with reference to either FIG. 7 or 12, it will be appreciated that a co-planar surface of dielectric surfaces and either patterned conductive trace surfaces or patterned etch stop surfaces is provided. After this step, resistors and/or capacitors can be formed as described above with reference to FIGS. 8 and 9.

Figure 13:
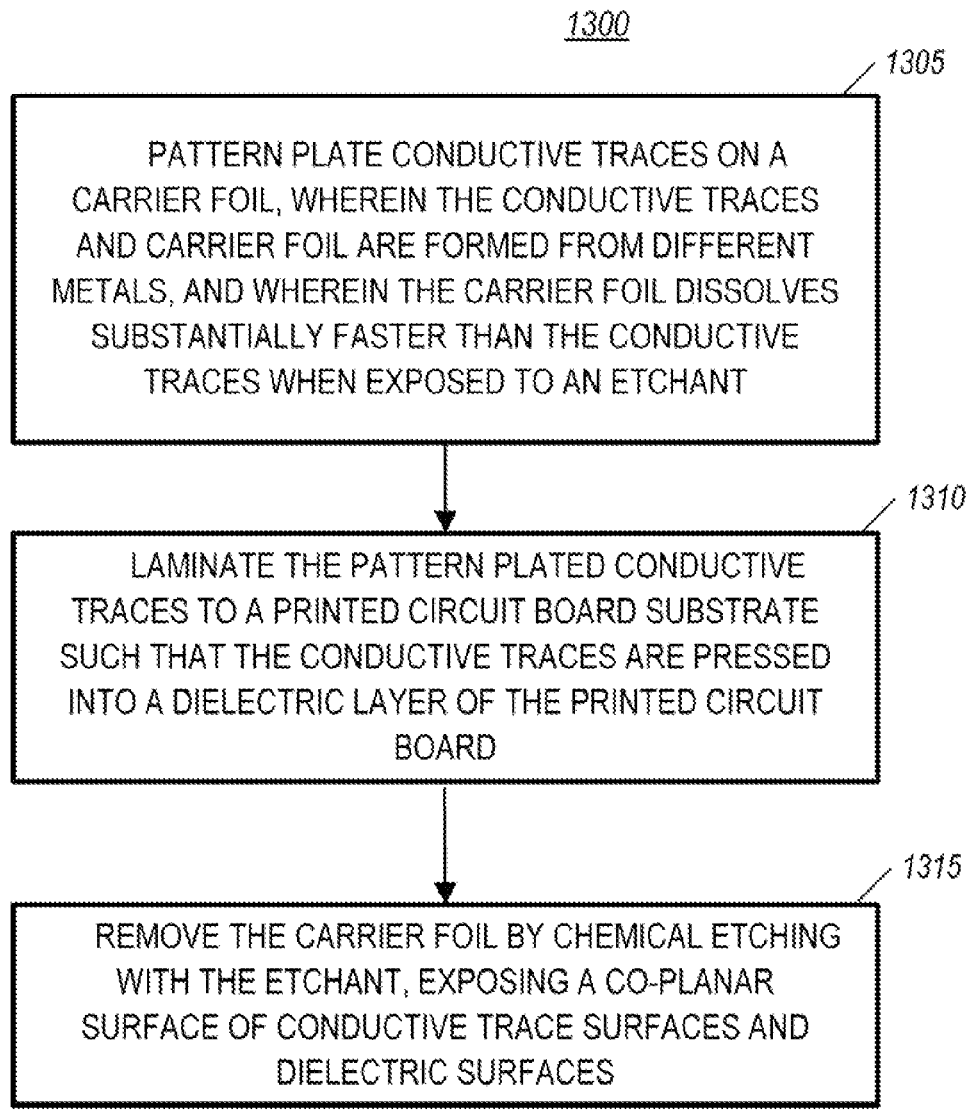
FIG. 13 is a flow chart of a method in accordance with certain of the embodiments.
Figure 14:
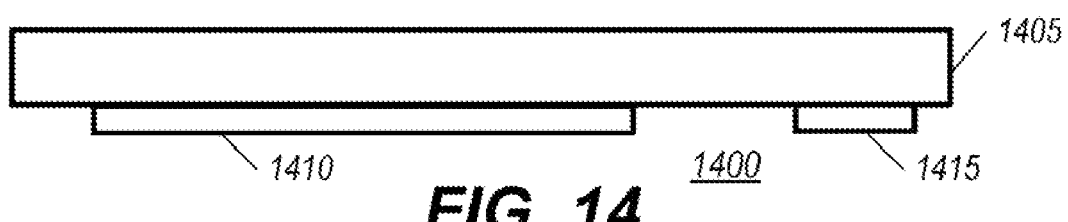
FIG. 14 is a cross section diagram of a foil assembly in accordance with certain of the embodiments.

Referring to FIG. 13, some steps of a method 1300 for fabricating a printed circuit board are shown, in accordance with certain embodiments. These steps will be described in conjunction with FIGS. 14-15, which are cross sectional diagrams of a carrier assembly 1400 and a portion of a printed circuit board 1500 that is in the process of having printed capacitors and/or resistors added to a layer.

At step 1305 (FIG. 13), conductive traces such as exemplary conductive traces 1410, 1415 (FIG. 14), are pattern plated onto a carrier foil 1405. The pattern plating may be done using a conventional additive process. The carrier foil 1405 is formed from a first metal material that differs from a second metal material from which the pattern plated conductive traces are formed. The first material is one that dissolves substantially faster than the second material when exposed to a particular etchant used for layer removal in a later step. Further, the first material should be compatible with the formation of the pattern plated circuit traces thereon, which may be performed using conventional printed circuit board patterning techniques. The pattern plated conductive traces may be formed by a conventional additive technique that results in copper traces that are, for example, 10 to 50 microns thick. In this example, the first metal material may be, for example, aluminum, and the second metal material may be, for example, copper, and the etchant may be, for example, sodium hydroxide. Other combinations of metals may be used for the pattern plated conductive traces and carrier foil, as long as the first metal material, second metal material, and etchant used for layer removal are selected that meet the criterion that the first metal is one that dissolves substantially faster than the second metal when exposed to the etchant. The patterned conductive metal traces may be added using other conventional techniques or new techniques.

Figure 15:
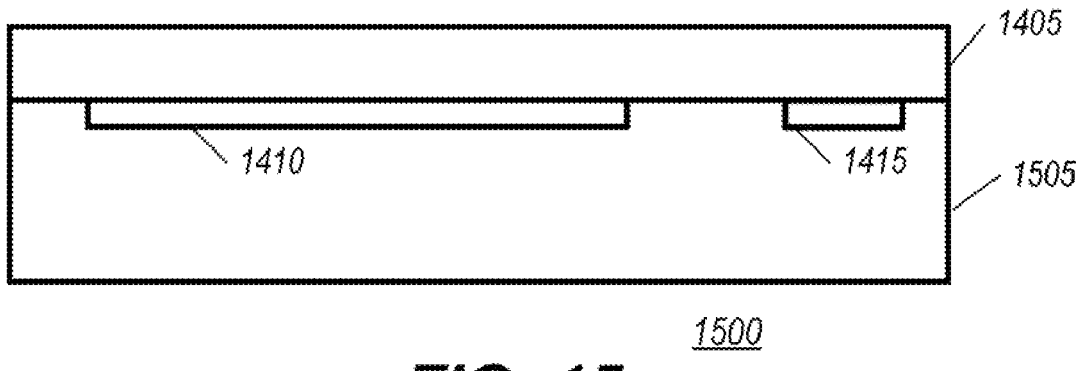
FIG. 15 is a cross section diagram of a foil assembly attached to a portion of a printed circuit board in accordance with certain of the embodiments.

At step 1310 (FIG. 13), the patterned conductive traces, including conductive traces 1410, 1415, are laminated to a dielectric layer 1505 (FIG. 15) of a printed circuit board substrate such that the conductive traces are pressed into the dielectric layer 1505 of the printed circuit board substrate. This step is essentially the same as step 120 (FIG. 1) except that when the dielectric material flows around the pattern plated conductive traces it becomes flush with the surface of the carrier foil 1405. FIG. 15 illustrates a stage in the process at which the material of the dielectric layer 1505 has flowed around the pattern plated conductive traces 1410, 1415.

At step 1315 (FIG. 13), the carrier foil 1405 is removed by using the layer removal etchant, which dissolves the first metal of the carrier foil 1405 substantially faster than the second metal of the pattern plated conductive traces. Substantially faster in this context means that the first metal is completely removed from the dielectric surface before the surfaces of the pattern plated conductive traces become eroded by the process to an extent typically more than 3 microns.

Figure 9:
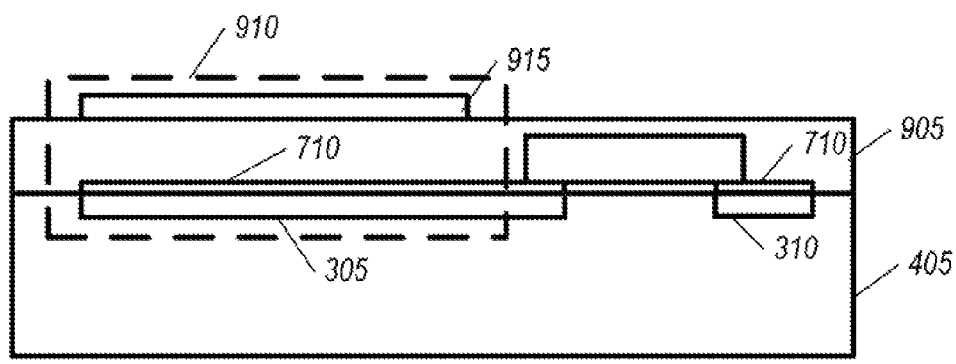

After the carrier foil 1405 has been removed in step 1315, the portion of the printed circuit board 1500 appears the same as the portion of the printed circuit board 400 in FIG. 7, and the process continues as described with reference to FIGS. 7-9.

It will be appreciated that the embodiments described above include techniques that result in higher quality printed circuit boards that include passive embedded components, by reducing undesirable variances in the values of the embedded components and higher reliability due to fewer voids in the inner layers of the printed circuit board.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A method for fabricating a printed circuit board, comprising:
    plating an etch stop layer on a thin foil;
    forming patterned conductive traces on the etch stop layer;
    laminating the patterned conductive traces to a printed circuit board substrate such that the patterned conductive traces are pressed into a dielectric layer of the printed circuit board; and
    removing the thin foil by chemical etching to expose a co-planar surface of dielectric surfaces and either patterned conductive trace surfaces or patterned etch stop surfaces.

2. The method according to claim 1, further comprising:
    removing the etch stop layer after removing the thin foil, thereby exposing a co-planar surface of dielectric surfaces and patterned conductive trace surfaces; and
    forming a silver or gold layer on the patterned conductive trace surfaces.

3. The method according to claim 2, wherein, at the step of removing the etch stop layer, the etch stop layer is either a panel layer or a patterned layer with patterned etch stop surfaces that match the patterned conductive traces.

4. The method according to claim 1, wherein, at the step of removing the thin foil, the etch stop layer is a patterned layer with patterned etch stop surfaces that match the patterned conductive traces, further comprising forming a silver or gold layer on the patterned etch stop surfaces.

5. The method according to claim 1, further comprising:
    adhering the thin foil to a carrier foil before plating the etch stop layer; and
    removing the carrier foil after laminating the pattern plated thin foil to the printed circuit board substrate.

6. The method according to claim 1, further comprising printing one or more resistors on the co-planar surface.

7. The method according to claim 6, further comprising forming a dielectric layer over the resistors and the co-planar surface.

8. The method according to claim 1, further comprising forming one or more capacitors on the co-planar surface, by
    applying a dielectric layer to the co-planar surface;
    applying a metal layer to the dielectric layer, and
    patterning the metal layer to form one or more capacitors.

9. The method according to claim 8, further comprising printing one or more resistors on the co-planar surface before applying the dielectric layer to the co-planar surface.

10. A method for fabricating a printed circuit board, comprising:
    pattern plating conductive traces on a carrier foil, wherein the conductive traces and carrier foil are formed from different metals, and wherein the carrier foil dissolves substantially faster than the conductive traces when exposed to an etchant;
    laminating the pattern plated conductive traces to a printed circuit board substrate such that the conductive traces are pressed into a dielectric layer of the printed circuit board; and
    removing the carrier foil by chemical etching using the etchant, exposing a co-planar surface of patterned conductive trace surfaces and dielectric surfaces.

11. The method according to claim 10, further comprising forming a silver or gold layer on the patterned conductive trace surfaces.

12. The method according to claim 10, further comprising printing one or more resistors on the co-planar surface.

13. The method according to claim 12, further comprising forming a dielectric layer over the resistors and the co-planar surface.

14. The method according to claim 10, further comprising forming one or more capacitors on the co-planar surface, by
    applying a dielectric layer to the co-planar surface;
    applying a metal layer to the dielectric layer, and
    patterning the metal layer to form one or more capacitors.

15. The method according to claim 14, further comprising printing one or more resistors on the co-planar surface before applying a dielectric layer to the co-planar surface.

* * * * *